United States Patent
Balakrishnan et al.

(10) Patent No.: US 9,490,332 B1
(45) Date of Patent: Nov. 8, 2016

(54) ATOMIC LAYER DOPING AND SPACER ENGINEERING FOR REDUCED EXTERNAL RESISTANCE IN FINFETS

(71) Applicant: International Business Machines Corporation, Armonk, NY (US)

(72) Inventors: Karthik Balakrishnan, White Plains, NY (US); Kevin K. Chan, Staten Island, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/918,737

(22) Filed: Oct. 21, 2015

(51) Int. Cl.
| | |
|---|---|
| H01L 21/00 | (2006.01) |
| H01L 29/00 | (2006.01) |
| H01L 29/417 | (2006.01) |
| H01L 29/78 | (2006.01) |
| H01L 29/66 | (2006.01) |
| H01L 21/324 | (2006.01) |

(52) U.S. Cl.
CPC ........ *H01L 29/41791* (2013.01); *H01L 21/324* (2013.01); *H01L 29/66545* (2013.01); *H01L 29/66795* (2013.01); *H01L 29/785* (2013.01)

(58) Field of Classification Search
CPC .............. H01L 29/41791; H01L 29/66795; H01L 29/785; H01L 29/66545; H01L 21/324; H01L 21/823431; H01L 21/823481
See application file for complete search history.

(56) References Cited

U.S. PATENT DOCUMENTS

| | | | |
|---|---|---|---|
| 7,872,303 B2 * | 1/2011 | Chan | ................ H01L 29/66795 257/329 |
| 8,361,895 B2 | 1/2013 | Lin et al. | |
| 8,772,874 B2 | 7/2014 | Cheng et al. | |
| 8,828,828 B2 | 9/2014 | Cheng et al. | |
| 9,048,261 B2 | 6/2015 | Chan et al. | |
| 2010/0038679 A1 * | 2/2010 | Chan | ................ H01L 29/66795 257/190 |
| 2013/0032865 A1 | 2/2013 | Chan et al. | |
| 2013/0032883 A1 | 2/2013 | Chan et al. | |
| 2013/0209685 A1 | 8/2013 | Ku et al. | |
| 2013/0221360 A1 | 8/2013 | Tsang | |
| 2014/0203361 A1 | 7/2014 | Adam et al. | |
| 2014/0203363 A1 | 7/2014 | Adam et al. | |

\* cited by examiner

*Primary Examiner* — Nikolay Yushin
(74) *Attorney, Agent, or Firm* — Harrington & Smith; Louis J. Percello

(57) ABSTRACT

A structure includes a fin having a gate structure disposed on a portion of a surface and an initial spacer layer disposed on the fin and gate structure. There are vertical steps in the fin adjacent to outer surfaces of the initial dielectric layer on first and second sides of the gate structure. The structure further has a dopant source layer on exposed surfaces of the fin and vertical steps; a secondary spacer disposed over the initial spacer and over a portion of the dopant source layer disposed on the vertical steps, and first and second RSDs abutted against outer sidewalls of the secondary spacer structure. In the structure there are diffused dopant atoms disposed in the fin beneath the secondary spacer and the initial spacer and towards a channel region that underlies the gate structure. A method to fabricate the structure is also disclosed, where the method includes ALDo.

20 Claims, 8 Drawing Sheets

ATOMIC LAYER DOPING AND SPACER ENGINEERING FOR REDUCED EXTERNAL RESISTANCE IN FINFETS

TECHNICAL FIELD

The various embodiments of this invention relate generally to semiconductor devices and fabrication techniques and, more specifically, relate to the fabrication of semiconductor transistor devices such as field effect transistors (FETs) that have a fin structure or fin structures (finFETs) including multiple gate FETs (MuGFETs).

BACKGROUND

External resistance in finFETs is undesirable as it results in increased access resistance due to the fin geometry. A high value of external resistance has a detrimental impact on finFET performance.

SUMMARY

In a first aspect thereof the embodiments of this invention provide a method that comprises providing a substrate having a top surface and a fin disposed over the top surface, where the fin is comprised of semiconductor material and has a gate structure disposed on a portion of a surface of the fin. The method further comprises depositing an initial dielectric spacer layer on the fin and gate structure; and etching the initial dielectric layer so as to retain a portion of the initial dielectric layer on sidewalls of the gate structure and to simultaneously remove a portion of the fin, where removing the portion of the fin reduces a thickness of the fin and creates a plurality vertical steps in the fin. A first vertical step is adjacent to an outer surface of the retained portion of the initial dielectric layer on a first side of the gate structure, and a second vertical step is adjacent to an outer surface of the retained portion of the initial dielectric layer on a second side of the gate structure opposite the first side. The method further includes performing an atomic layer doping operation to conformally deposit a dopant layer on exposed surfaces of the fin, including on the plurality of vertical steps; depositing a secondary spacer over the retained portion of the initial dielectric layer and over the dopant layer disposed on the plurality of vertical steps; and epitaxially depositing first and second raised source/drain structures on the fin. The method further includes performing an anneal operation to diffuse dopant atoms from the dopant layer disposed on the plurality of vertical steps into the fin whereby at least a portion of the dopant atoms are diffused into the fin beneath the secondary spacer and the initial spacer and towards a channel region that underlies the gate structure.

In another aspect thereof the embodiments of this invention provide a structure that comprises a substrate having a top surface and a fin disposed over the top surface, where the fin is comprised of semiconductor material and has a gate structure disposed on a portion of a surface of the fin. The structure further comprises an initial dielectric spacer layer disposed on the fin and gate structure and a plurality of vertical steps in the fin. A first vertical step is adjacent to an outer surface of the initial dielectric layer on a first side of the gate structure, and a second vertical step is adjacent to an outer surface of the initial dielectric layer on a second side of the gate structure opposite the first side. The structure further comprises a dopant source layer disposed on exposed surfaces of the fin, including on the plurality of vertical steps; a secondary dielectric spacer disposed over the initial dielectric spacer and over a portion of the dopant source layer that is disposed on the plurality of vertical steps, and first and second raised source/drain structures disposed on the fin and abutted against outer sidewalls of the secondary spacer structure. In the structure there are dopant atoms diffused from the dopant source layer that is disposed on the plurality of vertical steps, where the diffused dopant atoms are disposed in the fin beneath the secondary dielectric spacer and the initial dielectric spacer and towards a channel region that underlies the gate structure.

BRIEF DESCRIPTION OF THE SEVERAL VIEWS OF THE DRAWINGS

FIGS. 1A and 1B can be collectively referred to herein as FIG. 1. In FIGS. 1-8 the various layer thicknesses and other dimensions are not necessarily drawn to scale. More specifically:

FIG. 1A shows a starting structure as a portion of a SOI structure having a substrate, an overlying BOX layer, a fin defined in the SOI layer and a gate stack disposed on the fin;

FIG. 2 shows the structure of FIG. 1 after deposition of an initial gate spacer layer;

FIG. 3 shows the structure of FIG. 2 after performing an initial spacer etching process to form an etched initial spacer and to form steps in the surface of the fin adjacent to the outer edge of the etched initial spacer;

FIG. 4 shows the structure of FIG. 3 after performing an atomic layer doping (ALDo) process to conformally deposit a thin layer of a selected dopant on exposed surfaces of the fin, including the fin steps;

FIG. 5 shows the structure of FIG. 4 after depositing and etching a secondary spacer that covers the etched initial spacer and that portion of the ALDo dopant layer on the fin steps and that portion of the top surface of the fin adjacent to the fin steps; and FIG. 6 shows the structure of FIG. 5 after epitaxially depositing in situ doped raised source/drains (RSDs) on the fin adjacent to the secondary spacer and performing a high-temperature anneal process to activate the RSD dopant and to diffuse the ALDo dopant beneath the secondary spacer and the underlying etched initial spacer.

FIG. 7 illustrates the structure of FIG. 6 arrived at by the processes depicted in FIGS. 1-5, but where the gate stack is instead a dummy gate; and FIG. 8 shows the structure of FIG. 7 after a dielectric layer is blanket deposited, followed by removal of the dummy gate and its replacement with a metal gate stack.

DETAILED DESCRIPTION

Figure 1A:
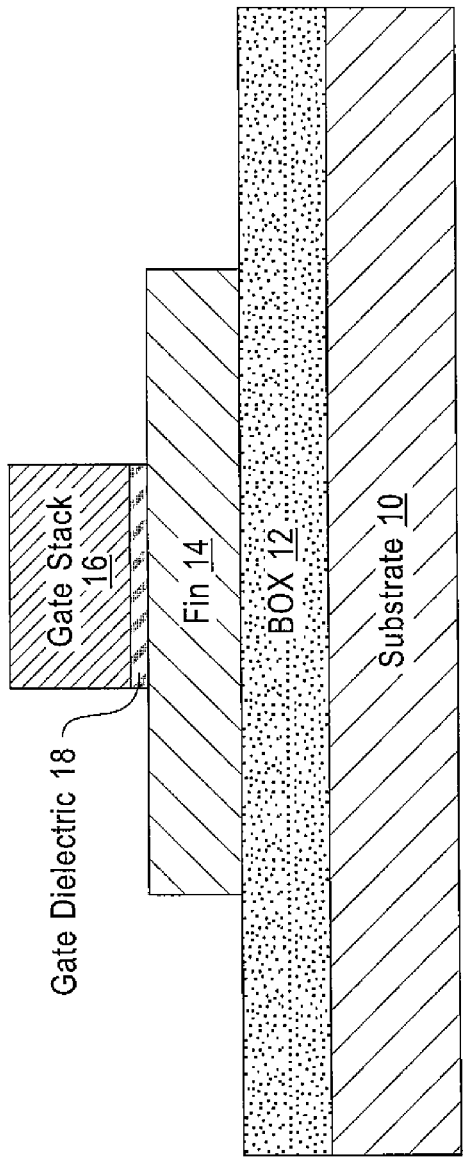
FIGS. 1A and 2-8 are each an enlarged cross-sectional view showing various initial, intermediate and completed or substantially completed structures that are fabricated in accordance with embodiments of this invention.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LP-CVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

In at least one embodiment thereof this invention can employ semiconductor on insulator (SOI) technology where a thin semiconductor layer, such as a layer of SiGe or a layer of Si, is formed over an insulating layer, such as silicon oxide, which in turn is formed over a (bulk) substrate, such as a Si substrate. The insulating layer can be referred to as a buried oxide (BOX) layer or simply as a BOX. For a single BOX SOI wafer the SOI layer can be divided into active regions by shallow trench isolation (STI) which intersects the BOX and provides total isolation for active device regions formed in the SOI layer. For finFET devices fin structures can be defined in the SOI layer and sources and drains can be formed, for example, epitaxial growth of in-situ doped raised source/drains (RSDs) or by ion implantation of N-type or P-type dopants into the fins. A FET channel region between a source/drain pair can be created so as to underlie a gate structure.

While certain aspects and embodiments of this invention can be employed with SOI substrates, the invention can also be realized using bulk (e.g., Si or SiGe) substrates.

Embodiments of this invention employ atomic layer doping (ALDo) in conjunction with spacer definition to reduce fin external resistance. The finFET device external resistance can be considered herein to be all resistance of the finFET external to the channel.

As an introduction, the embodiments of this invention can be realized by performing a conventional gate-first process flow, as well as by performing a gate replacement flow process, on a fin structure. For the gate-first process, and after gate structure (gate stack) fabrication, a thin layer of initial (precursor) gate spacer material is deposited on the gate stack. The gate stack is assumed to overlie a portion of the fin structure wherein a semiconductor channel region of a finFET is defined. The initial gate spacer material is then intentionally over-etched to create a loss in fin height (thickness) and to thereby form a step in the fin adjacent to the initial gate spacer. An ALDo process is then performed to apply a selected dopant material so as to create a thin layer of the selected dopant material on the fin as well as on the fin step adjacent to the initial gate spacer. A secondary gate spacer is then formed so as to overlie the initial gate spacer and the thin layer of the selected dopant material on the fin step. An anneal is then performed to diffuse the thin layer of the selected dopant material into the fin and to form adjacent to the channel region an electrically active doping concentration beneath the secondary spacer and the initial spacer, thereby reducing external resistance of the finFET. The diffused dopants on the fin aid in reducing external resistance due to their close proximity to the channel region.

FIG. 1A shows a portion of a wafer that, in this non-limiting embodiment, is a SOI structure having a substrate 10, e.g., a Si substrate, and an overlying BOX layer 12. A fin 14 has been defined in the SOI layer that is, in this example, assumed to be comprised of a SiGe alloy. In other embodiments the fin 14 could be comprised primarily of Si or it could be comprised primarily of Ge. In other embodiments the fin 14 could be comprised of a Group III-V material such as a layer of GaAs, GaSb, InGaAs, or InGaSb. In other embodiments a quaternary Group material could be used. In the Group III-V embodiments one or more suitable buffer/lattice accommodation layers could be formed between the fin 16 and the substrate 10. Fin definition can be obtained in a conventional manner by masking the surface of the SOI layer and then etching to remove the SOI semiconductor except where the fin is desired. In the illustrated example the fin 14 is etched to the surface of the BOX layer 12.

In other embodiments the BOX 12 may not be present and the fin 14 can be defined directly in the substrate 10 or defined in a semiconductor layer disposed directly on or indirectly on the substrate 10. For example, the substrate 10 could be Si and there can be a graded SiGe layer that is epitaxially grown on the Si substrate and the fin 14 can be defined in an upper surface region of the graded SiGe layer. In other words, the teachings of this invention are not intended to be limited with respect to the nature or the composition of the substrate on which the fin 16 is disposed, or with respect to the nature or the composition of the fin 16.

Figure 1B:
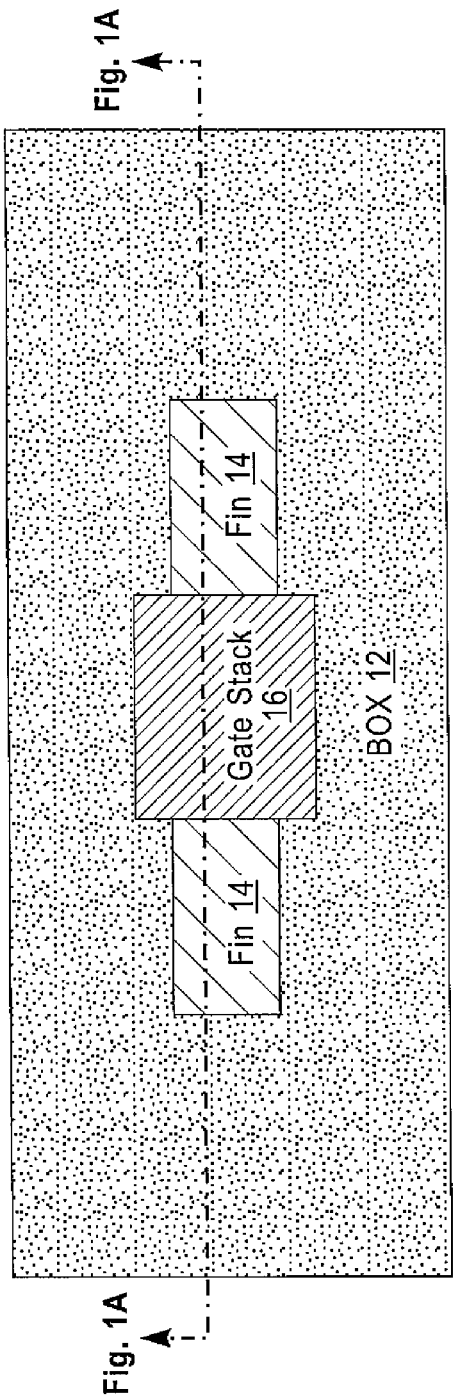
FIG. 1B is an enlarged top view of the structure depicted in FIG. 1A.

The height (thickness) of the fin 14 could be in exemplary range of about 30 nm to about 70 nm while the fin width (into the drawing page) could be in a range of about 4 nm to about 10 nm, with 7 nm being one suitable nominal value. In the illustrated embodiment, over a portion of the fin 14 is deposited a gate stack 16 disposed on a thin layer of gate dielectric 18. The gate stack 16 could have a height (thickness) in an exemplary range of about 20 nm to about 30 nm and the gate length (parallel to the surface of the BOX 12 and along the fin 14) can be in an exemplary range of about 10 nm to about 20 nm. The top view of FIG. 1B shows that the gate stack 16 can overlap sidewalls of the fin 14 thereby surrounding the fin 14 on three sides.

Note that in some embodiments there could be two or more fins 14 present in a parallel side-by-side arrangement and all of the fins 14 could pass through the same common gate stack 16. Further, in a typical implementation there can be thousands or millions of fins present over the surface of the substrate. The single fin present in FIG. 1 is illustrated for convenience and to simplify the description of the various embodiments of this invention.

The gate dielectric 18 could be, for example, formed as a layer of high dielectric constant (high-k or HK) material comprising a dielectric metal oxide and having a dielectric constant that is greater than the dielectric constant of silicon nitride (7.5). The gate dielectric layer 18 may be formed by methods known in the art including, for example, chemical vapor deposition (CVD), atomic layer deposition (ALD), molecular beam deposition (MBD), pulsed laser deposition (PLD) and liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x can be independently established from about 0.5 to about 3.0, and each value of y can be independently established from about 0 to about 2.0. The thickness of the gate dielectric layer 18 may be from about 1 nm to about 10 nm, and more preferably from about 1.5 nm to about 3 nm. The gate dielectric layer 18 can have an effective oxide thickness (EOT) on the order of, or less than, about 1 nm.

The gate stack 16 can be deposited directly on the surface of the gate dielectric layer 18 by, for example, chemical vapor deposition (CVD), physical vapor deposition (PVD), or atomic layer deposition (ALD). As non-limiting examples the gate stack 16 can include a metal system selected from one or more of TiN, TiC, TiAlC, TaN, TaC, TaAlC, TaSiN, HfN, W, Al and Ru, and may be selected at least in part based on the desired work function (WF) of the device (nFET or pFET), as is known.

It should be noted that the gate stack 16 in some embodiments could be formed later, as discussed below, and thus at this point in the fabrication process the gate stack 16 could instead be a dummy or sacrificial gate structure, e.g., an oxide or a nitride or polycrystalline Silicon (poly-Si) structure, that is subsequently removed and replaced with the metal (functional) gate stack 16.

Figure 2:
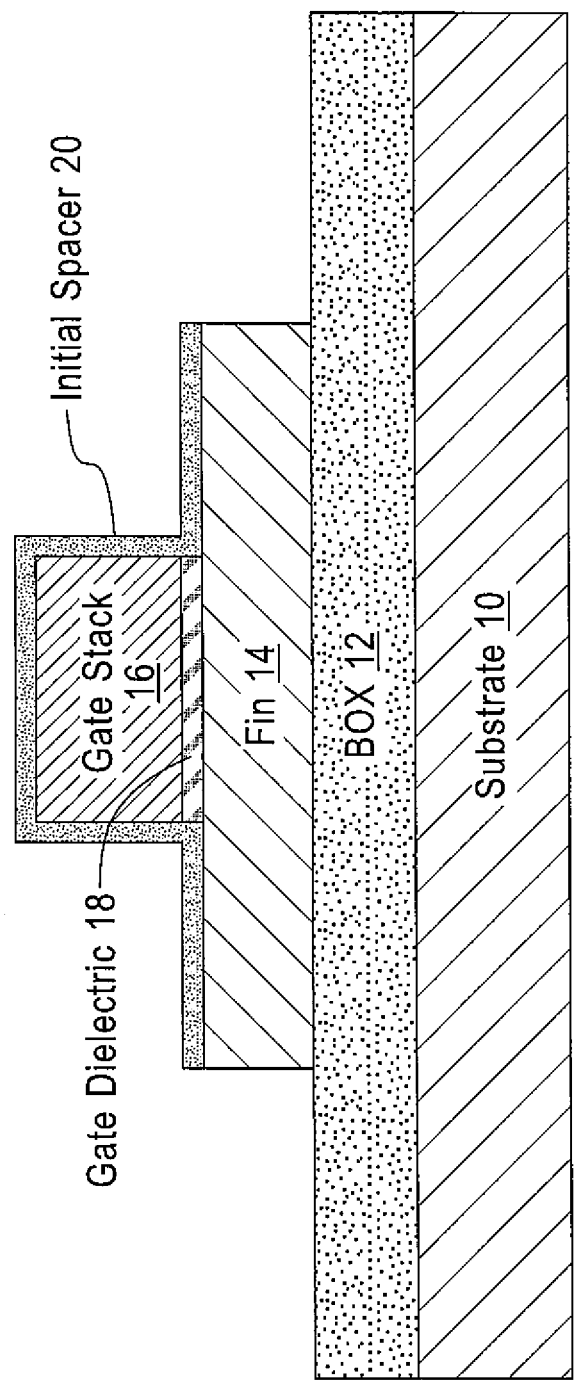

FIG. 2 shows the structure of FIG. 1 after deposition of an initial gate spacer layer 20. The initial spacer layer 20 is preferably a thin dielectric layer having a thickness selected so that a subsequent etching step (FIG. 3) results in an initial spacer thickness in an exemplary range of about 2 nm to about 5 nm so as to position a subsequent ALDo dopant deposition as close as possible to what will be a fin channel region that underlies the gate stack 16. The initial gate spacer layer 20 could be comprised of, for example, Silicon Nitride (e.g., $Si_3N_4$) or Boron Nitride (BN).

Figure 3:
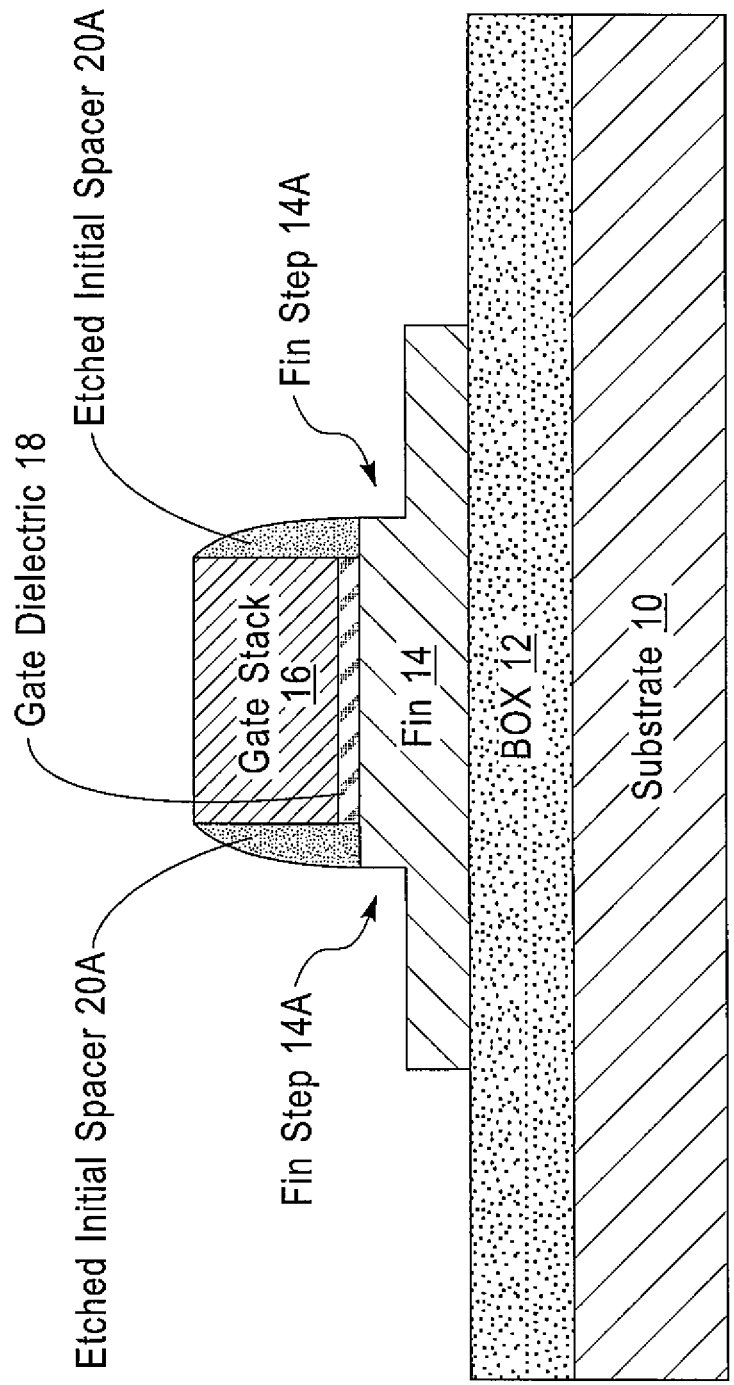

FIG. 3 shows the structure of FIG. 2 after performing an initial spacer etching process. This can be accomplished by performing a reactive ion etch (RIE) using, for example, fluorine-containing mixtures such as, for example, $CF_4/H_2$, $CF_4/O_2/N_2$, $SF_6/O_2/N_2$, $SF_6/CH_4/N_2$ and $SF_6/CH_4/N_2/O_2$. The initial spacer etching process forms an etched initial spacer 20A around the gate stack 16 and is performed so as to over-etch the spacer material 20 and to also then simultaneously create some fin loss. The fin loss is manifested at least in a reduction in the thickness of that portion of the fin 16 that is exposed to the initial spacer etchant. The result is the formation of recesses or notches or steps 14A in the surface of the fin 14 adjacent to the outer edge of the etched initial spacer 20A. That is, the over-etching process forms the plurality of vertical steps 16A in the fin 16, where a first vertical step is adjacent to an outer surface of the retained portion of the initial dielectric layer on a first side of the gate stack 16, and where a second vertical step is adjacent to an outer surface of the retained portion of the initial dielectric layer on a second side of the gate stack opposite the first side. The height of the fin step 14A can be, as one non-limiting example, in a range of about 10% to about 20% of the total fin height (thickness). As examples, if the initial thickness of the fin 14 is 30 nm then the height of the fin step 14A can be about 5 nm, while if the initial thickness of the fin 14 is 60 nm then the height of the fin step 14A can be about 10 nm. The fin steps 14A can be assumed to have the same height and to be symmetrically disposed on both sides of the gate stack 16.

The selectivity of the initial spacer etch can be determined using the following equation:

$$\text{Selectivity} = H_{fin}/\Delta H,$$

where $H_{fin}$ is the fin height, and $\Delta H$ is the amount of the fin 16 that is recessed from the top of the fin. For example, if $H_{fin}=30$ nm and the desired recess is 10 nm (33% in this non-limiting case), the needed selectivity is 3:1. The reason is that, to clear the etched initial spacer 20A from the fin sidewall, it is desirable to etch by an amount equal to $H_{fin}$. At the same time, it is desired to recess the fin by $\Delta H$. Therefore, the selectivity=$H_{fin}/\Delta H$.

As was noted above, the thickness of the etched initial spacer 10A can be in an exemplary range of about 2 nm to about 5 nm. The as-deposited thickness of the initial spacer layer 20 is related at least in part to the desired final thickness and the selectivity.

Figure 4:
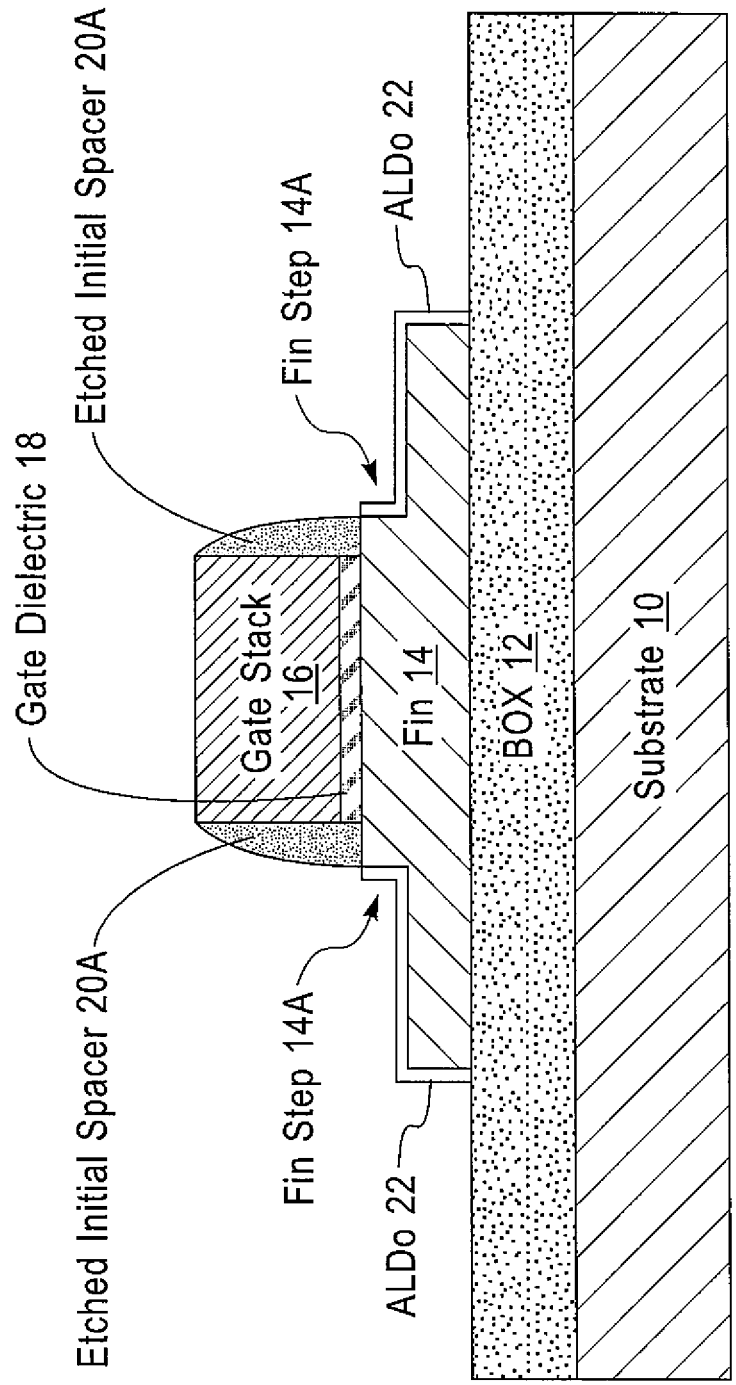

FIG. 4 shows the structure of FIG. 3 after performing an ALDo process that conformally deposits a thin layer 22 (e.g., a monolayer or a few monolayers) of a selected dopant such as Boron on exposed surfaces of the fin 16. One suitable technique for performing the ALDo process is disclosed in commonly assigned US Patent Publication 2013/0032865 A1, "Fabrication of Field-Effect Transistors with Atomic Layer Doping" by Kevin K. Chan et al. Briefly, diborane gas (for p-type) or phosphine gas (n-type) can be prepared. A preferable flow range of diborane gas is about 10 to 100 sccm (standard cubic centimeters per minute) and 1 to 100 SLM (standard liters per minute) flow of $H_2$ or He can be used as a carrier gas. For the phosphine gas example, 10 to 100 sccm of Phosphine in 1 to 100 SLM of $H_2$ or He is preferred. The dopant gas can be mixed with a selective inhibitor. For example, the dopant gas can be mixed with 10 to 250 sccm of hydrochloric acid at a specific pressure of 3 to 100 torr and at a temperature range of 350° C. to 750° C. Alternatively, the dopant gas can be mixed with 5 to 100 sccm of dichlorosilane and 10 to 250 sccm of Hydrochloric acid at a specific pressure of 3 to 100 torr and at a temperature range of 350° C. to 750° C.

The selective atomic layer dopant growth process can be performed in a reaction chamber to grow one or more monolayers of the resultant mixture on a semiconductor surface, such as, for example, a Si or SiGe or Ge surface. In accordance with one exemplary implementation, to achieve the low resistivity properties of the dopant monolayer the growth process is conducted at a pressure of under 500 Torr, preferably between 7 Torr and 50 Torr, at a temperature of between about 300° C. to about 750° C., preferably in a range of about 300° C. to about 600° C. In one example, an ALDo B and SiGe matrix can be grown using 5 to 100 sccm of dichlorosilane and 10 to 250 sccm of hydrochloric acid at 3 torr to 100 torr and a temperature of 350° C. to 750° C.

The growth process described by Chan et al. can be used to cover the three-dimensional surface of the fin 16 shown in FIG. 4 in a conformal manner. In one example, for p-type FET (PFET) devices and using the preferred ranges described above, one or more monolayers of p-type doping material based on boron are mostly active as deposited with a dopant concentration of, for example, $1 \times 10^{22}$ atoms/cm$^3$ with at least $1 \times 10^{21}$ atoms/cm$^3$ Boron activated. In another example, for n-type FET (NFET) devices, monolayers of n-type doping material based on phosphorous are greater than 60% active after annealing with a dopant concentration of, for example, $1 \times 10^{21}$ atoms/cm$^3$. In this example, at least $4 \times 10^{20}$ phosphorous atoms/cm$^3$ can be activated, post-annealing.

The ALDo process can be used in the embodiments of this invention to provide the thin dopant layer 22, e.g., a layer of Boron, on the exposed surfaces of the fin 16, including the vertical surfaces of the steps 16A, having an active dopant concentration in an exemplary and non-limiting range of about $4 \times 10^{20}$ atoms/cm$^3$ to about $1 \times 10^{21}$ atoms/cm$^3$. The dopant layer 22 can be considered to function as a source of dopant atoms capable of being diffused into the underlying semiconductor material of the fin 14. After the high temperature anneal and dopant diffusion procedure described below with reference to FIG. 6 it can be the case that some portion of the ALDo dopant layer 22 is retained on the surface of the fin 14.

Figure 5:
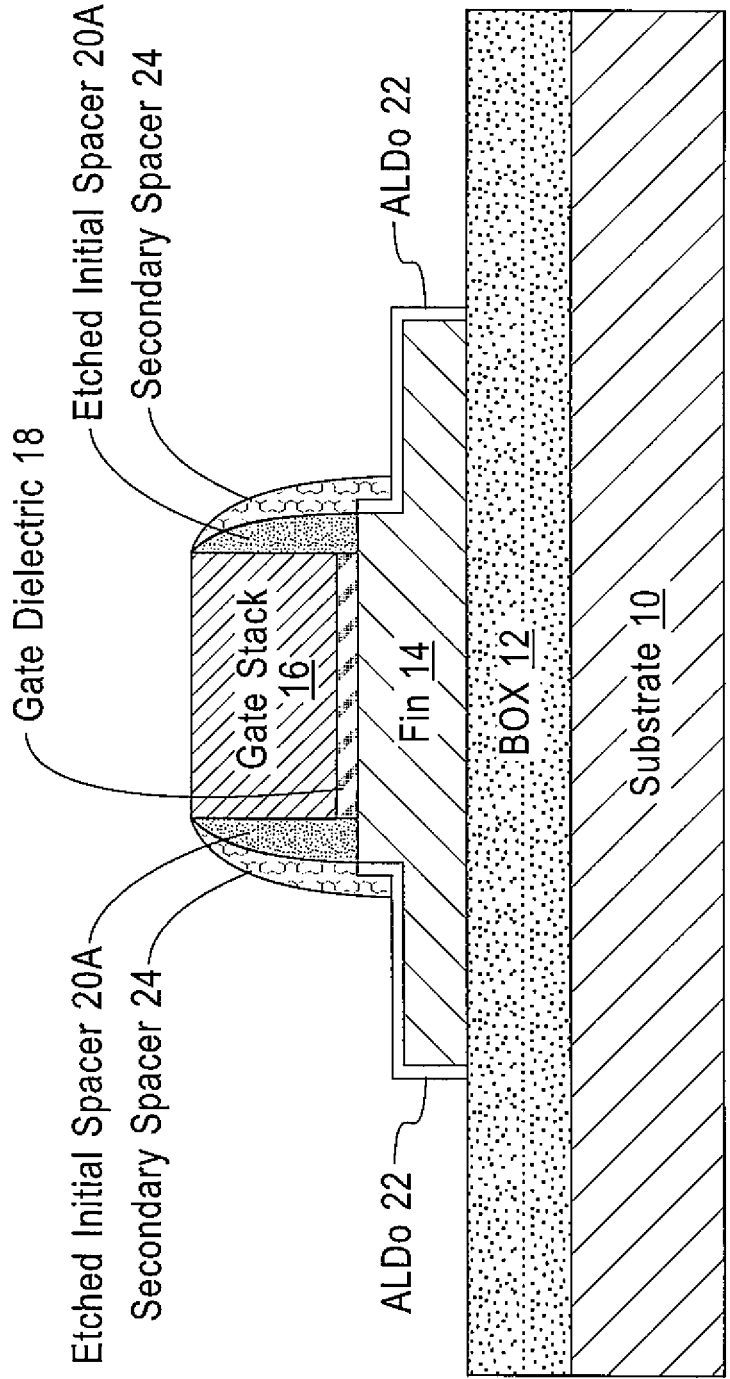

FIG. 5 shows the structure of FIG. 4 after patterning and depositing and etching a secondary spacer 24 (e.g., Si$_3$N$_4$ or BN) having a thickness in an exemplary range of about 5 nm to about 10 nm. The secondary spacer 24 covers the etched initial spacer 20A as well as that portion of the ALDo layer 22 on the fin step 14A and that portion on the top surface of the fin 14 adjacent to the fin step 14A.

Figure 6:
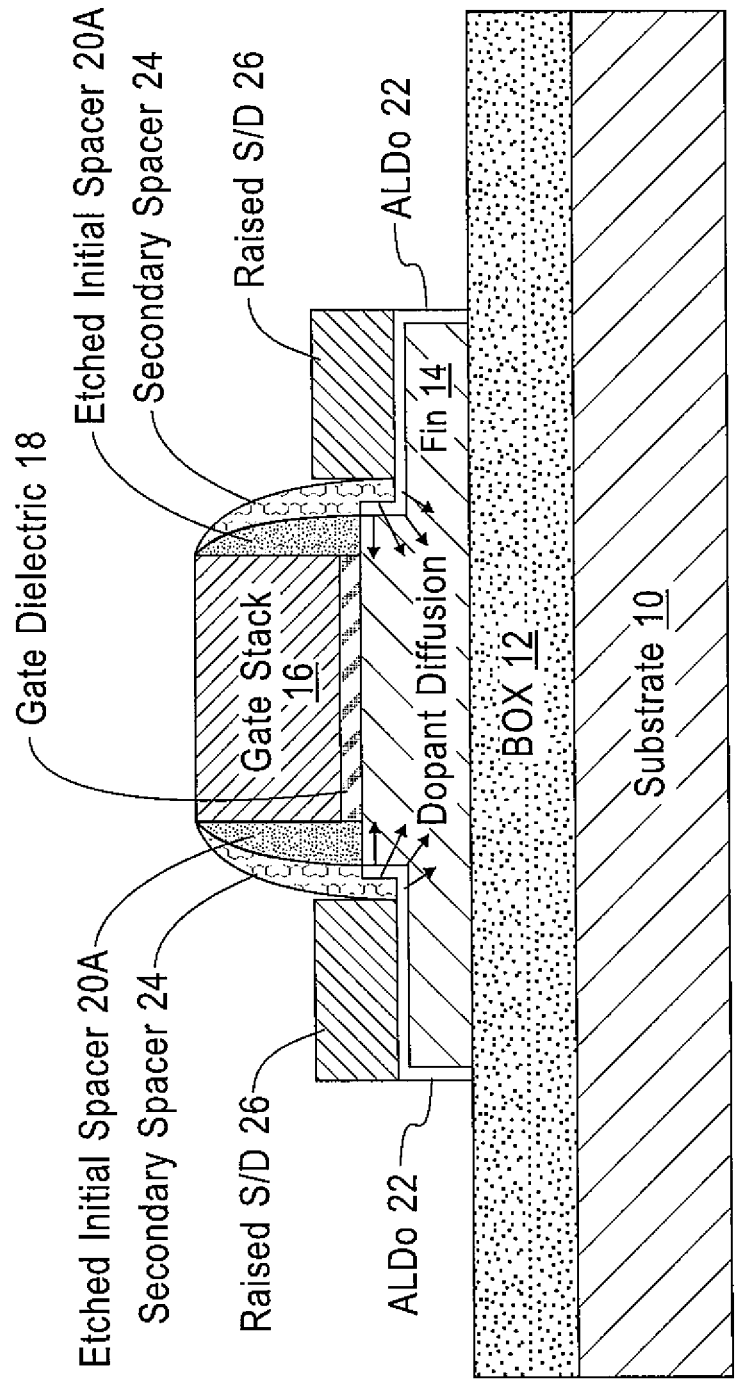

FIG. 6 shows the structure of FIG. 5 after patterning and epitaxially depositing raised source/drains (RSDs) 26 on the fin 14 and adjacent to the secondary spacer 24. As an example, the RSDs 26 can be in-situ doped SiGe and can have a dopant concentration in a range of, as a non-limiting example, about $5 \times 10^{19}$ atoms/cm$^3$ to about $8 \times 10^{21}$ atoms/cm$^3$. Phosphorus is one suitable n-type dopant, and Boron is one suitable p-type dopant. It is pointed out that the dopant selected for the in situ doped RSDs 26 may or may not be the same dopant used for the ALDo process, although both dopants (if not the same species) should be the same type (i.e., n-type or p-type). An inner edge (closest to the gate stack 16) of each RSD 26 can closely abut (i.e., contact or almost contact) an outer surface of the secondary spacer 24.

After forming the RSDs 26 a high-temperature anneal process is performed to diffuse at least some of the dopant atoms from ALDo dopant layer 22 on the surface of the steps 16A into the extrinsic S/D of the device, allowing for an electrically active doping concentration underneath the spacers 24 and 20A and, as a result, reduced external resistance. The anneal process also activates the dopant atoms contained in the doped RSDs 26.

The anneal process can be, for example, a rapid thermal anneal (RTA) conducted in a temperature range of about 650° C. to about 1100° C. for a predetermined period of time such as about 5 seconds to about 10 seconds. A laser spike anneal (LSA) or a flash anneal could also be used.

As can be seen in FIG. 6 the ALDo dopant diffuses through the semiconductor material of the fin 14 and at least a portion of the dopant atoms diffuse under the spacers 24, 20A and towards the device channel that exists under the gate stack 16. A beneficial result of the diffusion of the ALDo dopant atoms is that the external resistance of the resulting finFET device is reduced from what it would be if the diffused ALDo dopants were not present.

Figure 7:
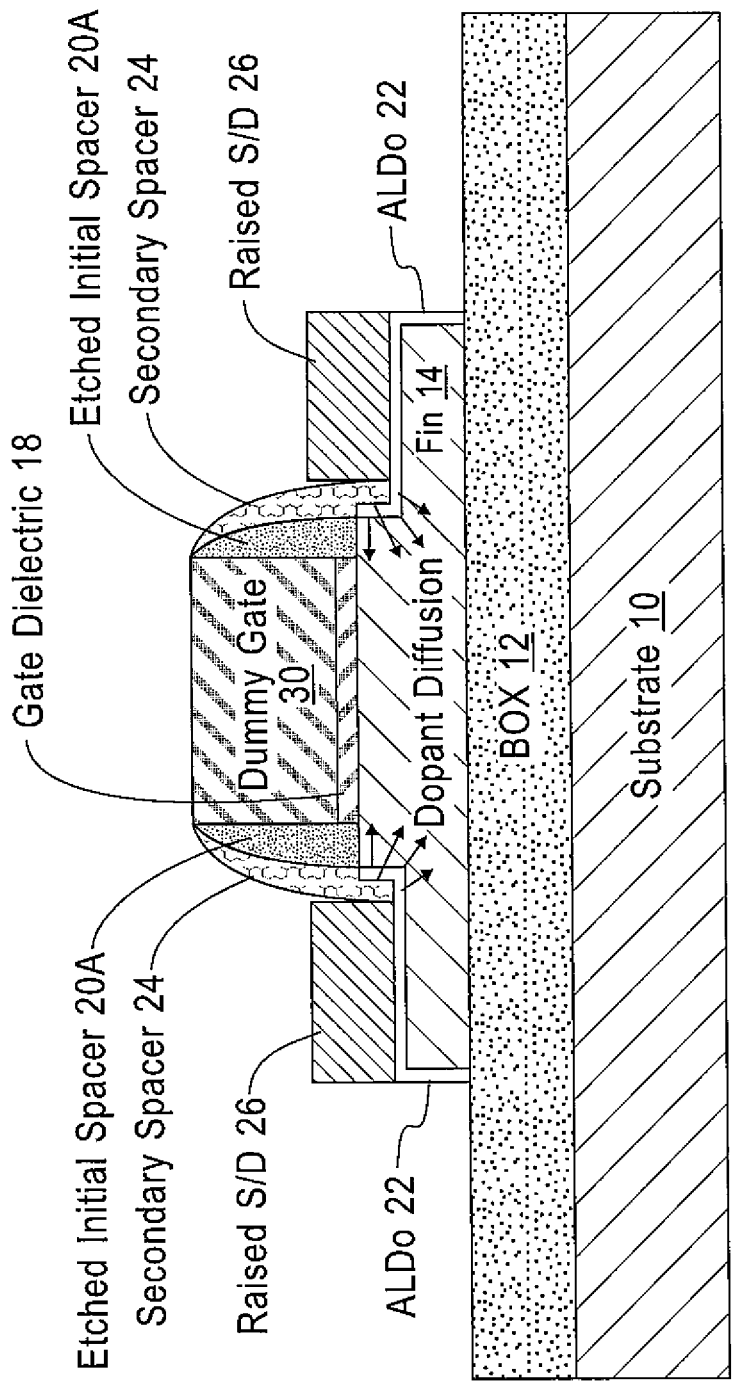

It was noted above that the embodiments of this invention also encompass finFET fabrication techniques that use a replacement metal gate (RMG) process. Reference can be made to FIG. 7 where there is illustrated the structure of FIG. 6 arrived at by the processes depicted in FIGS. 1-5, but where the gate stack 16 is instead a dummy gate 30 such as one comprised of an oxide or a nitride or of poly-Si. In this case it is assumed that the initial spacer 20 has been over-etched to form the steps 16A as in FIG. 3, that the ALDo operation has been performed as in FIG. 4, that the secondary spacer 24 has been formed as in FIG. 5, and that the RSDs 26 have been epitaxial deposited and the dopant activation and diffusion anneal has been performed as in FIG. 6.

Figure 8:
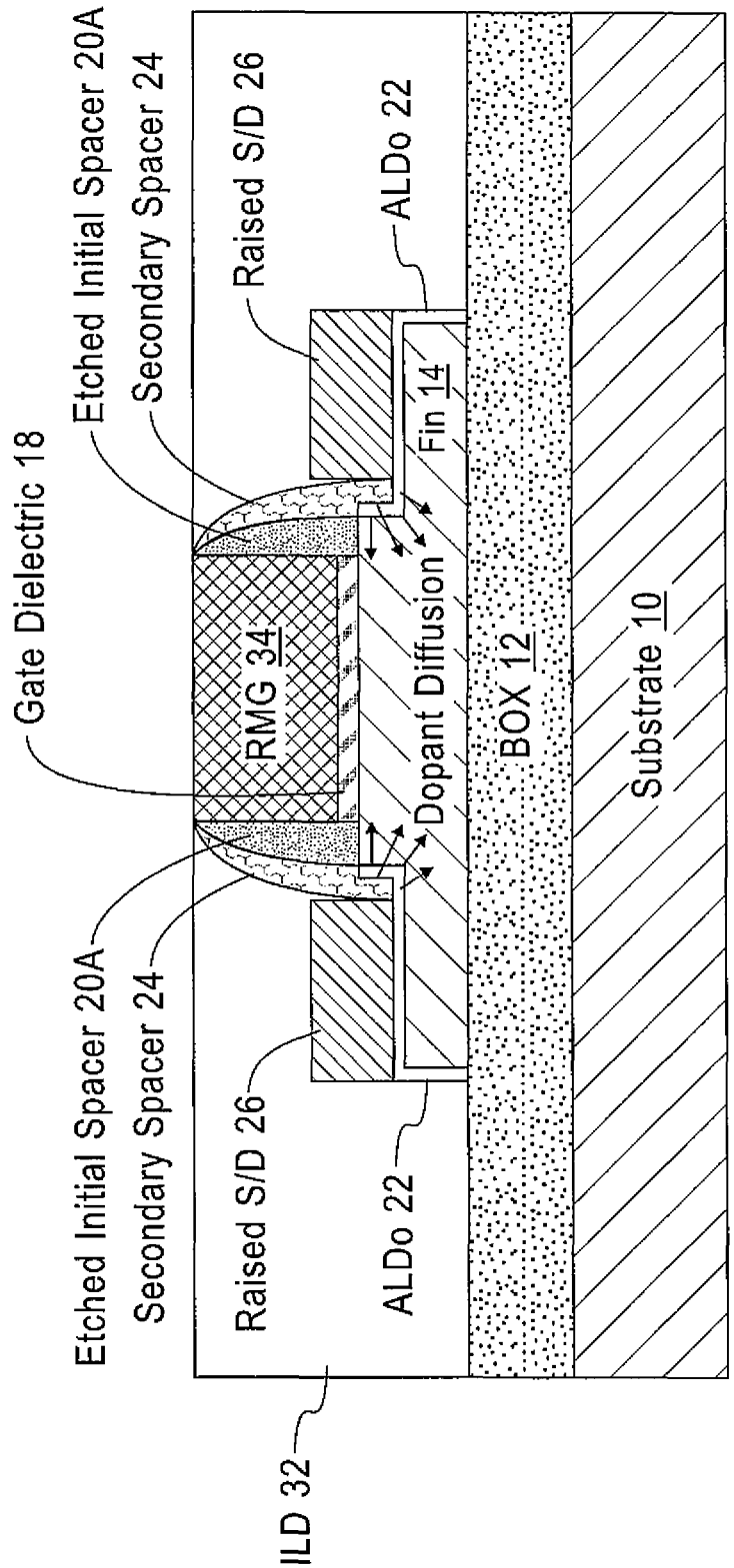

FIG. 8 shows the structure of FIG. 7 after a dielectric layer is blanket deposited, e.g., an inter-layer dielectric (ILD) 32, such as a layer of low dielectric constant CVD-deposited SiO$_2$, followed by removal of the dummy gate 30 and its replacement with a metal gate stack that is referred to in FIG. 8 as the RMG 34. The RMG 34 can be compositionally and dimensionally equivalent to the gate stack 16 described above.

Whether the original metal gate embodiment of FIGS. 1-6 or the replacement metal gate embodiment of FIGS. 7 and 8 is selected, processing can then continue in a conventional manner, for example, to form one or more dielectric layers (e.g., ILD, if not already present, and back end of line (BEOL) dielectric layers), to form gate contacts and S/D contacts, and to form vertical and horizontal conductive interconnects as is known in the art in order to connect the finFET and other finFETs into a desired circuit configuration.

In the process described above the metal gate stack 16 and the dummy gate 30 can both be considered to represent a 'gate structure' upon which the initial spacer 20 and the secondary spacer 24 are deposited.

It is noted that any one of the structures shown in FIGS. 1-8 could be viewed as an intermediate structure formed during the overall process of providing a finFET device having reduced external resistance.

It is to be understood that the exemplary embodiments discussed above with reference to FIGS. 1-8 can be used on common variants of a FET device including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes and chemistries, anneal processes and temperatures/times, and doping processes may be used by those skilled in the art. Further, the exemplary embodiments are not intended to be limited to only those materials, metals, dielectrics, dopants, dopant concentrations, layer thicknesses and the like that were specifically disclosed above. Any and all such and similar modifications of the teachings of this invention will still fall within the scope of this invention.

What is claimed is:

1. A method, comprising:
   providing a substrate having a top surface and a fin disposed over the top surface, the fin being comprised of semiconductor material and having a gate structure disposed on a portion of a surface of the fin;
   depositing an initial dielectric spacer layer on the fin and gate structure;
   etching the initial dielectric layer so as to retain a portion of the initial dielectric layer on sidewalls of the gate structure and to simultaneously remove a portion of the fin, where removing the portion of the fin reduces a thickness of the fin and creates a plurality vertical steps in the fin, where a first vertical step is adjacent to an outer surface of the retained portion of the initial dielectric layer on a first side of the gate structure, and where a second vertical step is adjacent to an outer surface of the retained portion of the initial dielectric layer on a second side of the gate structure opposite the first side;
   performing a doping operation to conformally deposit a dopant layer on exposed surfaces of the fin, including on the plurality of vertical steps;
   depositing a secondary spacer over the retained portion of the initial dielectric layer and over the dopant layer disposed on the plurality of vertical steps;
   epitaxially depositing first and second raised source/drain structures on the fin; and
   performing an anneal operation to diffuse dopant atoms from the dopant layer disposed on the plurality of vertical steps into the fin whereby at least a portion of the dopant atoms are diffused into the fin beneath the secondary spacer and the initial spacer and towards a channel region that underlies the gate structure.

2. The method as in claim 1, where the retained portion of the initial dielectric layer has a thickness in a range of about 2 nm to about 5 nm.

3. The method as in claim 1, where the secondary spacer has a thickness in a range of about 5 nm to about 10 nm.

4. The method as in claim 1, where the first and second raised source/drain structures are in situ doped raised source/drain structures, and where performing the anneal operation simultaneously activates a dopant contained in the in situ doped raised source/drain structures.

5. The method as in claim 1, where the anneal operation is a rapid thermal anneal conducted at a temperature in a range of about 650° C. to about 1100° C.

6. The method as in claim 1, where the doping operation is an atomic layer doping operation and where the fin is comprised of a semiconductor material that comprises one of Si, Ge, SiGe and a Group III-V semiconductor material.

7. The method as in claim 1, where the gate structure is comprised of a metal gate stack that is disposed over a gate dielectric layer that is disposed on the surface of the fin.

8. The method as in claim 1, where the gate structure is comprised of a dummy gate structure that is disposed on the surface of the fin, and where the method further comprises:
   after performing the anneal operation, removing the dummy gate structure; and
   depositing a metal gate stack where the dummy gate stack was removed.

9. The method as in claim 8, where the steps of removing the dummy gate structure and depositing the metal gate stack are preceded by a step of depositing an interlayer dielectric layer.

10. The method as in claim 1, where the fin is comprised of SiGe, and where the doping operation conformally deposits one or more monolayers of Boron on the exposed surfaces of the fin.

11. The method as in claim 10, where the Boron has an active dopant concentration in a range of about $4 \times 10^{20}$ atoms/cm$^3$ to about $1 \times 10^{21}$ atoms/cm$^3$.

12. The method as in claim 1, where the step of annealing reduces an external resistance of a finFET transistor that comprises the fin and the gate structure.

13. The method as in claim 1, where the first raised source/drain structure has an edge that substantially abuts an outer surface of the secondary spacer on the first side of the gate structure and where the second raised source/drain structure has an edge that substantially abuts an outer surface of the secondary spacer on the second side of the gate structure that is opposite the first side.

14. A structure, comprising:
   a substrate having a top surface and a fin disposed over the top surface, the fin being comprised of semiconductor material and having a gate structure disposed on a portion of a surface of the fin;
   an initial dielectric spacer having a bottom surface disposed on a top surface of the fin and an inner surface disposed on and around sidewalls of the gate structure;

where there are a plurality of vertical steps in the fin, where a first vertical step is adjacent to an outer surface of the initial dielectric spacer on a first side of the gate structure, and where a second vertical step is adjacent to an outer surface of the initial dielectric spacer on a second side of the gate structure opposite the first side;

a dopant source layer having a top surface and a predetermined thickness, the dopant source layer further having a bottom surface that is disposed on exposed surfaces of the fin, including on the plurality of vertical steps;

a secondary dielectric spacer disposed over an outer surface of the initial dielectric spacer and over a portion of the top surface of the dopant source layer that is disposed on the plurality of vertical steps;

first and second raised source/drain structures disposed on the fin and abutted against outer sidewalls of the secondary dielectric spacer; and dopant atoms diffused from the dopant source layer that is disposed on the plurality of vertical steps, the diffused dopant atoms being disposed in the fin beneath the secondary dielectric spacer and beneath the initial dielectric spacer and towards a channel region that underlies the gate structure.

15. The structure of claim 14, where the initial dielectric spacer has a thickness in a range of about 2 nm to about 5 nm, and where the secondary dielectric spacer has a thickness in a range of about 5 nm to about 10 nm.

16. The structure of claim 14, where the first and the second raised source/drain structures are in situ doped raised source/drain structures.

17. The structure of claim 14, where the fin is comprised of semiconductor material that comprises one of Si, Ge, SiGe and a Group III-V semiconductor material.

18. The structure of claim 14, where the gate structure is comprised of a metal gate stack that is disposed over a gate dielectric layer that is disposed on the surface of the fin.

19. A structure, comprising:
a substrate having a top surface and a fin disposed over the top surface, the fin being comprised of semiconductor material and having a gate structure disposed on a portion of a surface of the fin;

an initial dielectric spacer disposed on the fin and gate structure;

where there are a plurality of vertical steps in the fin, where a first vertical step is adjacent to an outer surface of the initial dielectric spacer on a first side of the gate structure, and where a second vertical step is adjacent to an outer surface of the initial dielectric spacer on a second side of the gate structure opposite the first side;

a dopant source layer disposed on exposed surfaces of the fin, including on the plurality of vertical steps;

a secondary dielectric spacer disposed over the initial dielectric spacer and over a portion of the dopant source layer that is disposed on the plurality of vertical steps;

first and second raised source/drain structures disposed on the fin and abutted against outer sidewalls of the secondary dielectric spacer; and dopant atoms diffused from the dopant source layer that is disposed on the plurality of vertical steps, the diffused dopant atoms being disposed in the fin beneath the secondary dielectric spacer and beneath the initial dielectric spacer and towards a channel region that underlies the gate structure, where the fin is comprised of SiGe, and where the dopant layer is formed during an atomic layer doping operation that deposits one or more monolayers of Boron on exposed surfaces of the fin, where the Boron has a dopant concentration in a range of about $4 \times 10^{20}$ atoms/cm$^3$ to about $1 \times 10^{21}$ atoms/cm$^3$.

20. The structure of claim 14, where the gate structure is comprised of a sacrificial replacement gate structure that is disposed over a gate dielectric layer that is disposed on the surface of the fin.

* * * * *